United States Patent [19]
Takaya

[11] Patent Number: 5,987,337
[45] Date of Patent: Nov. 16, 1999

[54] RADIO PAGER

[75] Inventor: Kei Takaya, Shizuoka, Japan

[73] Assignee: NEC Corporation, Tokyo, Japan

[21] Appl. No.: 08/874,479

[22] Filed: Jun. 16, 1997

[30] Foreign Application Priority Data

Jun. 17, 1996 [JP] Japan .................................. 8-155218

[51] Int. Cl.$^6$ .............................. H01M 2/02; H04B 1/38
[52] U.S. Cl. ........................... 455/572; 455/269; 429/96; 429/178
[58] Field of Search ................................. 429/7, 10, 96, 429/100, 178; 455/90, 269, 351, 347, 575, 572, 550; 439/500

[56] References Cited

U.S. PATENT DOCUMENTS 5,586,907  12/1996  Frantz et al. .............................. 429/96
5,863,218  1/1999  Quat et al. ................................. 429/96
5,863,674  1/1999  Yamanaka .................................. 429/96

FOREIGN PATENT DOCUMENTS 2 226 457  6/1990  United Kingdom .

OTHER PUBLICATIONS

"Pager Design Techniques", WHITE SERIES No. 158, published by Tiriceps (Japan) Oct. 25, 1994, pp. 62–68.

*Primary Examiner*—Nguyen Vo
*Assistant Examiner*—Greta J. Fuller
*Attorney, Agent, or Firm*—Whitham, Curtis & Whitham

[57] ABSTRACT

A radio pager of the present invention includes battery terminals each having an inductance component. The pager therefore reduces the fall of antenna efficiency as far as possible without resorting to any extra part. In addition, a coin type battery is located in the vicinity of short bars included in the pager so as to prevent the antenna efficiency from decreasing.

9 Claims, 3 Drawing Sheets

//\*\*\*

RADIO PAGER

BACKGROUND OF THE INVENTION

The present invention relates to a radio pager and, more particularly, to a radio pager including an antenna sandwiching a coin type battery.

A problem with a radio pager using a coin type battery is that when the battery is positioned in the vicinity of an antenna, a magnetic field is generated when a current flows through a conductor. The magnetic field disturbs an electromagnetic field around the antenna and thereby lowers the efficiency of the antenna. In light of this, it has been customary with the radio pager to add coils or similar parts having impedance components or to so position the battery as not to effect the antenna. Such conventional schemes, however, increase the number of parts of the pager and obstruct a miniature, low cost configuration and reliable operation.

Technologies relating to the present invention are disclosed in, e.g., "Pager Design Techniques", WHITE SERIES No. 158 published by Tiriceps (Japan) on Oct. 25, 1994, pp. 62–68.

SUMMARY OF THE INVENTION

It is therefore an object of the present invention to provide a radio pager capable of reducing the influence of a coin type battery on an antenna as far as possible without resorting to any extra part.

A radio pager using a coin type battery of the present invention includes an antenna, a printed circuit board on which circuitry is arranged, and a pair of battery terminals. The battery terminals respectively connect the positive and negative terminals of a coin type battery, positioned within the antenna, and the circuitry of the printed circuit board, and each is configured to have a great inductance component.

BRIEF DESCRIPTION OF THE DRAWINGS

The above and other objects, features and advantages of the present invention will become apparent from the following detailed description taken with the accompanying drawings in which.

In the drawings, identical structural elements are designated by identical reference numerals.

DESCRIPTION OF THE PREFERRED EMBODIMENT

Figure 1:
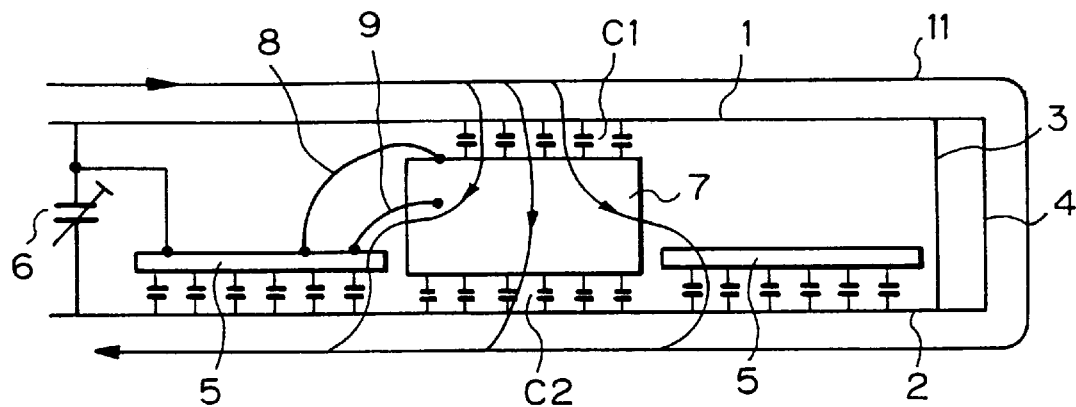
FIG. 1 shows a conventional card type radio pager.

To better understand the present invention, brief reference will be made to a conventional card type radio pager, shown in FIG. 1. As shown, the radio pager includes an antenna made up of a pair of sheet metals 1 and 2, short bars 3 and 4 shorting the sheet metals 1 and 2, and a matching circuit 6. A coin type battery 7 is positioned inside of the antenna. Battery terminals 8 and 9 respectively connect the positive and negative terminals of the battery 7 to circuitry provided on a printed circuit board 5. In this configuration, a distributed capacitance C1 exists between one of the sheet metals 1 and 2 and the battery 7 while a distributed capacitance C2 exists between the other sheet metal and the battery 7. The capacitances C1 and C2 cause a high frequency current 11 flowing into the antenna to partly flow from the sheet metal 1 into the sheet metal 2 via various routes. As a result, the current 11 expected to flow through the short bars 3 and 4 is reduced in amount, lowering the efficiency of the antenna.

Figure 2:
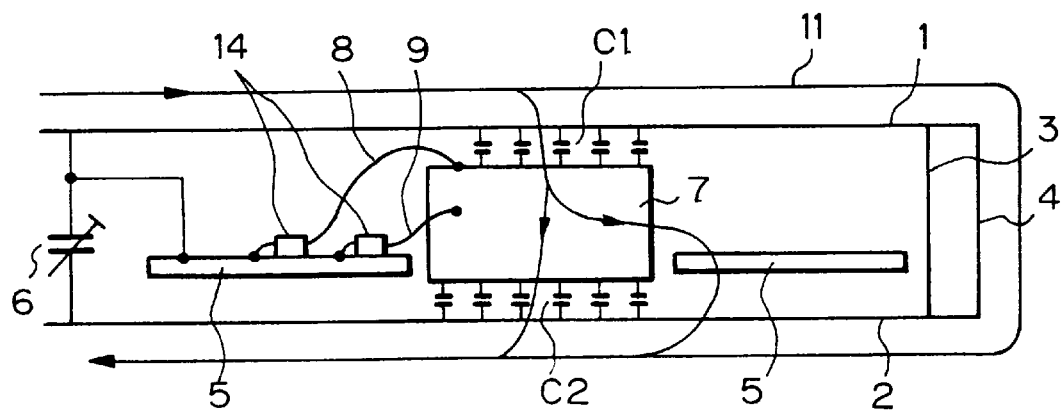
FIG. 2 shows a specific implementation for solving a problem particular to the radio pager of FIG. 1.

FIG. 2 shows a specific implementation for solving the above problem, i.e., for preventing the high frequency current 11 from flowing to the circuitry of the printed circuit board 5. As shown, parts 14 having a great impedance with respect to AC, e.g., coils are connected between the battery 7 and the circuitry of the circuit board 5. This kind of scheme, however, increases the number of parts and thereby obstructs a miniature, low cost configuration and reliable operation.

Figure 3:
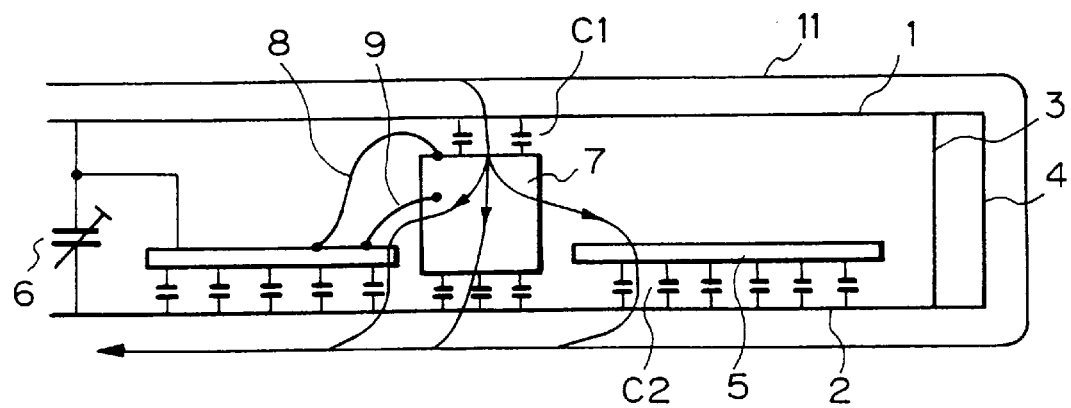
FIG. 3 shows another specific implementation for solving the same problem.

Alternatively, as shown in FIG. 3, the size of the battery 7 may be reduced in order to prevent the antenna efficiency from being lowered. However, the problem with the small battery 7 is that it must be replaced in a short period of time due to its limited capacity.

Figure 4:
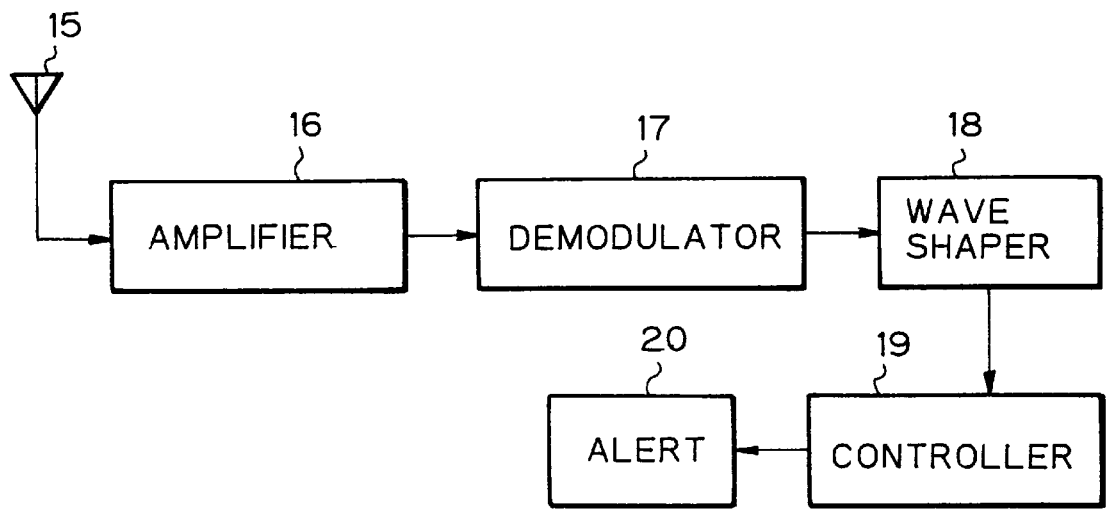
FIG. 4 is a block diagram schematically showing the general construction of a radio pager.

Referring to FIG. 4, the general circuit arrangement of a radio pager is shown in a block diagram. As shown, a paging signal coming in through an antenna 15 is amplified by an amplifier 16, demodulated by a demodulator 17, and then fed to a wave shaper 18. The wave shaper 18 transforms the demodulated signal output from the demodulator 17 to a digital signal which a controller 19 can read. The digital signal contains an address number and a message. If the address number is identical with an address number assigned to and stored in the pager, the controller 19 delivers the message to an alert 20.

Figure 5:
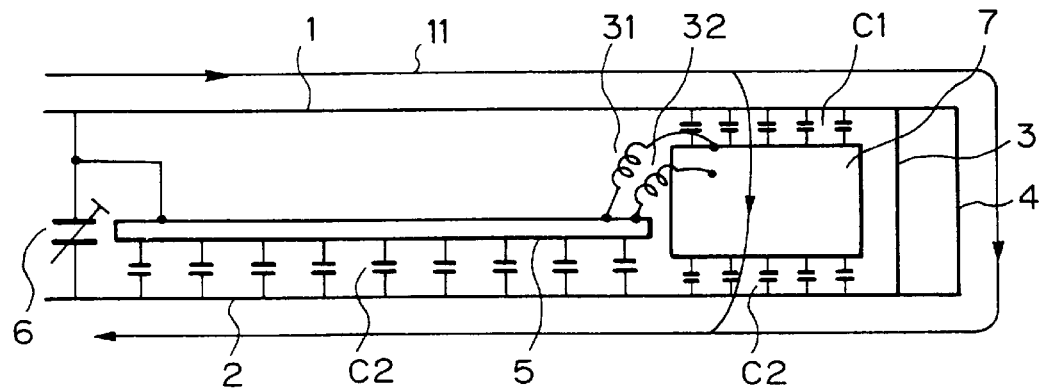
FIG. 5 shows a radio pager embodying the present invention.

A radio pager embodying the present invention will be described with reference to FIG. 5. As shown, the radio pager includes a pair of sheet meals 1 and 2 interconnected by a pair of short bars 3 and 4. An antenna matching circuit 6 is connected between the sheet metals 1 and 2 at the side opposite to the side where the sheet metals 1 and 2 are connected by the short bars 3 and 4. The sheet meals 1 and 2, short bars 3 and 4 and matching circuit 6 constitute an antenna in combination. The matching circuit 6 is connected to the amplifier, FIG. 4, mounted on a printed circuit board 5. A coin type battery 7 is positioned in the vicinity of the short bars 3 and 4. Battery terminals 31 and 32 respectively connect the positive and negative terminals of the battery 7 to circuitry provided on the circuit board 5.

Figure 6:
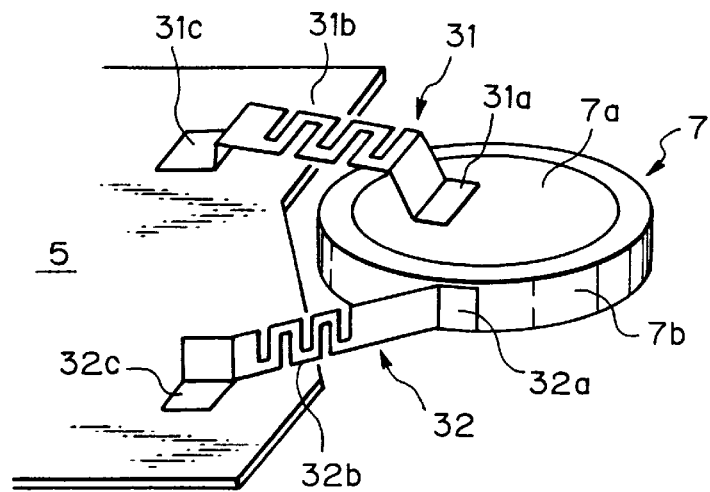
FIG. 6 shows battery terminals included in the embodiment in detail.

As shown in FIG. 6, the battery terminals 31 and 32 have a unique configuration, and each is stamped out of an elastic sheet of metal. The positive and negative terminals of the battery 7 are labeled 7a and 7b, respectively. The battery terminal 31 has a contact portion 31a resiliently contacting the positive terminal 7a of the battery 7, a portion 31c connected to the circuit board 5, and a bent portion 31b connecting the two portions 31a and 31c. Likewise, the battery terminal 32 has a contact portion 32a resiliently contacting the negative terminal 7b of the battery 7, a portion 32c connected to the circuit board 5, and a bent portion 32b connecting the two portions 32a and 32c. Each battery terminal 31 or 32 is provided with a zig-zag configuration and therefore an inductance component. The battery terminals 31 and 32 are suitably bent in such a manner as to facilitate their contact with the terminals 7a and 7b of the battery 7.

Figure 7:
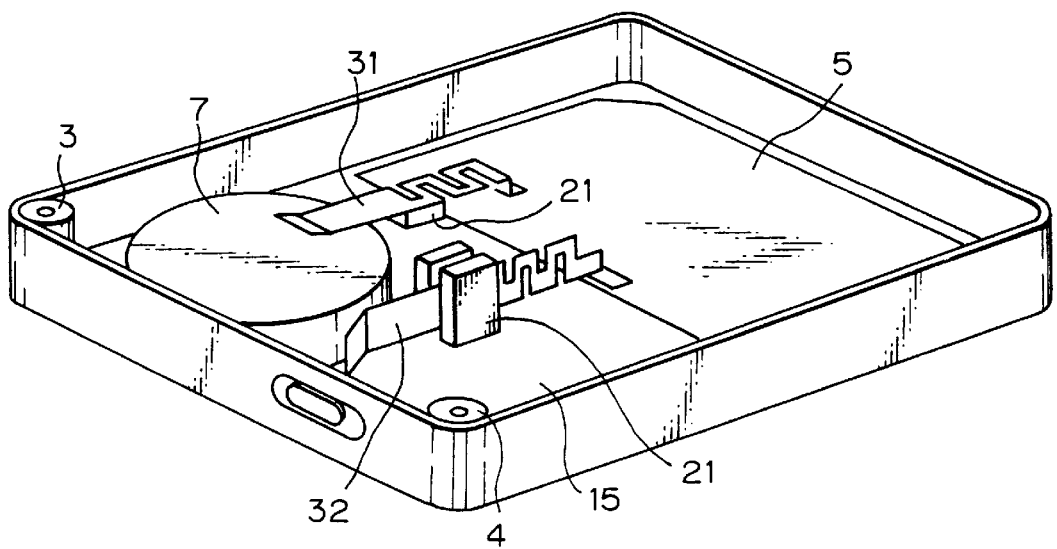
FIG. 7 is a perspective view showing the illustrative embodiment while omitting an upper sheet metal.

FIG. 7 shows the pager having the above configuration while omitting the upper sheet metal. As shown, the battery 7 is positioned in the vicinity of the short bars 3 and 4. The battery terminal 31 is sandwiched between two ribs 21 formed on the lower sheet metal. Likewise, the battery terminal 32 is sandwiched between a rib 21 formed on the lower sheet metal and a rib, not shown, formed on the upper sheet metal. The ribs 21 prevent the pressure with which the battery terminals 31 and 32 contact the battery 7.

In the illustrative embodiment, the antenna circuit constituted by the sheet metals 1 and 2, short bars 3 and 4 and matching circuit 6 excites a high frequency current 11. Although the current 11 tends to flow into the circuit board 5 via the battery terminals 31 and 32, it is blocked by the bent portions, or inductance components, 31b and 32b of the terminals 31 and 32. As a result, the antenna frequency o f the pager is prevented from being lowered.

A part of the above current 11 still flows through a distributed capacitance C1, the battery 7, and a distributed capacitance C2. However, because the battery 7 is located in the vicinity of the short bars 3 and 4, such a part of the current 11 is shorted in the vicinity of the short bars 3 and 4. This also prevents the antenna frequency from being lowered.

In summary, in accordance with the present invention, a radio pager includes battery terminals each having an inductance component. The pager therefore reduces the fall of antenna efficiency as far as possible without resorting to any extra part. In addition, a coin type battery is located in the vicinity of short bars included in the pager so as to prevent the antenna efficiency from decreasing.

Various modifications will become possible for those skilled in the art after receiving the teachings of the present disclosure without departing from the scope thereof.

What is claimed is:

1. A radio pager using a coin type battery, comprising:
    an antenna,
    a printed circuit board on which circuitry is arranged; and
    a pair of battery terminals respectively connecting a positive and a negative terminal of a coin type battery, positioned within said antenna, and said circuitry of said printed circuit board, said pair of battery terminals each having an in line inductance component to mitigate capacitance between the antenna and the coin type battery.

2. A radio pager as claimed in claim 1, wherein said battery terminals each comprise a contact portion contacting one of the positive and negative terminals of the battery, a portion connected to said circuitry, and a zig-zag portion connecting said contact portion and said portion connected to said circuitry.

3. A radio pager as claimed in claim 2, further comprising ribs sandwiching said battery terminals for maintaining a pressure with which said contact portion contacts said battery.

4. A radio pager as claimed in claim 2, wherein said antenna comprises a pair of sheet metals, a pair of short bars connecting said pair of sheet metals, and a matching circuit.

5. A radio pager as claimed in claim 4, wherein said battery is positioned in the vicinity of said pair of short bars.

6. A radio device using a coin-type battery having improved antenna efficiency, comprising:
    an antenna, comprising a first and second conductive sheets separated by a space;
    a coin-type battery holding area positioned within said space between said first and said second conductive sheets; and
    first and second battery terminals for contacting a positive and a negative terminal of a battery when positioned in said coin-type battery holding area;
    said first and second battery terminals having a zig-zag shape comprising an inductance component for mitigating a capacitance component between the battery and the first and second conductive sheets for improving antenna efficiency.

7. A radio device using a coin-type battery having improved antenna efficiency as recited in claim 6 wherein said first and second battery terminals comprise an elastic sheet metal.

8. A radio device using a coin-type battery having improved antenna efficiency as recited in claim 7 wherein said zig-zag shape of said first and second battery terminals comprises staggered notches on either side of a rectangularly shaped sheet metal.

9. A radio device using a coin-type battery having improved antenna efficiency as recited in claim 6 wherein said first and second conducive sheets are connected by a pair of short bars near the battery holding area.

* * * * *